(12) United States Patent
Tsubata et al.

(10) Patent No.: US 7,893,509 B2
(45) Date of Patent: Feb. 22, 2011

(54) TRANSISTOR AND CVD APPARATUS USED TO DEPOSIT GATE INSULATING FILM THEREOF

(75) Inventors: Toshihide Tsubata, Mie (JP); Toshinori Sugihara, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/474,353

(22) Filed: May 29, 2009

(65) Prior Publication Data
US 2009/0236642 A1 Sep. 24, 2009

Related U.S. Application Data

(62) Division of application No. 10/595,640, filed as application No. PCT/JP2004/018051 on Dec. 3, 2004, now Pat. No. 7,557,416.

(30) Foreign Application Priority Data
Dec. 3, 2003 (JP) ............................. 2003-404895

(51) Int. Cl.
*H01L 29/786* (2006.01)

(52) U.S. Cl. ............................... 257/410; 257/E29.273
(58) Field of Classification Search .................. 257/410
See application file for complete search history.

(56) References Cited

U.S. PATENT DOCUMENTS 5,891,349 A * 4/1999 Tobe et al. ..................... 216/68

FOREIGN PATENT DOCUMENTS

JP 11-330474 * 11/1999

OTHER PUBLICATIONS

Tsubata et al.; "Transistor and CVD Apparatus Used to Deposit Gate Insulating Film Thereof"; U.S. Appl. No. 10/595,640, filed May 2, 2006.

* cited by examiner

*Primary Examiner*—Evan Pert
(74) *Attorney, Agent, or Firm*—Keating & Bennett, LLP

(57) ABSTRACT

In a transistor adapted to suppress characteristic degradation resulting from fluorine contained in a deposited film, the concentration of fluorine contained in a gate insulating film is reduced to $1.0 \times 10^{20}$ atoms/cm$^3$ or less. As a result, the transistor can provide excellent reliability even when it is continuously driven for a long period of time at a relatively high temperature.

2 Claims, 4 Drawing Sheets

TRANSISTOR AND CVD APPARATUS USED TO DEPOSIT GATE INSULATING FILM THEREOF

FIELD OF THE INVENTION

The present invention relates to an improvement in a transistor and, more particularly, to a method for improving the reliability thereof when the transistor is continuously driven for a long period of time at a relatively high temperature.

DESCRIPTION OF THE RELATED ART

Among field-effect transistors each of which typically comprises at least a source electrode, a drain electrode, a gate electrode, a semiconductor film, and a gate insulating film each interposed between the source/drain electrodes and the gate electrode, a field-effect transistor comprising an amorphous silicon nitride film deposited by a CVD (Chemical Vapor Deposition) method or the like as the gate insulating film has excellent ON/OFF-state current characteristics so that, in recent years, it has been used also as a switching element for a liquid crystal display device or the like.

When a thin film such as a gate insulating film is deposited by using a CVD apparatus, cleaning of the inside of the reaction chamber of the CVD apparatus is performed by using a cleaning gas such as $NF_3$, $CF_4$, or $SF_6$ in each given deposition cycle to improve the maintenance property of the CVD apparatus and thereby improve the operability thereof. At this time, if fluorine as one component of the cleaning gas remains in the reaction chamber and is caught in the film being deposited, it causes the problem of significantly degrading the transistor characteristics.

As a method for solving this problem, the reduction of the concentration of fluorine contained in the semiconductor film to $1.0 \times 10^{19}$ atoms/cm$^3$ or less is disclosed in Patent Gazette 1. As means for reducing the concentration of fluorine, the removal of residual fluorine by generating a hydrogen plasma after the cleaning of the reaction chamber is disclosed. It is reported that, by reducing the concentration of fluorine contained in the semiconductor film, an increase in the amount of shift in threshold voltage when the transistor is operated for 10 minutes under the condition that the substrate temperature is 25.0±3.0° C. can be reduced and the reliability of the transistor can be thereby improved.

As an example of an approach which reduces the concentration of fluorine in a thin film other than a thin film composing the transistor such as the semiconductor film or the gate insulating film, a method is disclosed in Patent Gazette 2. In accordance with the method, when a silicon dioxide film is disposed as a protective film for an insulating substrate between the transistor and the insulating substrate, the concentration of fluorine in the silicon dioxide film is reduced to $1 \times 10^{19}$ atoms/cm$^3$ or less, preferably to $1 \times 10^{18}$ atoms/cm$^3$ or less, by spraying heated gas to an a-Si film deposited by a plasma CVD method and thereby oxidizing the a-Si film into the silicon dioxide film.

Patent Gazette 1: Japanese Laid-Open Patent Publication No. 2002-329869 (page 2, FIG. 1)

Patent Gazette 2: Japanese Laid-Open Patent Publication No. 2003-124469 (page 2, FIG. 1)

SUMMARY OF THE INVENTION

In the method disclosed in Patent Gazette 1, however, evaluation is performed at a relatively low temperature of about 25° C. during short-period driving that continues for only 10 minutes. Therefore, it is unknown whether or not the transistor can provide excellent reliability even when it is continuously driven for a long period of time (on the orders of several to several tens of hours) at a relatively high temperature (e.g., about 80° C.), like a transistor as a switching element for a pixel electrode in a liquid crystal display device.

In the method which removes the residual fluorine in the reaction chamber therefrom by the hydrogen plasma process, a sufficient effect may not be obtained occasionally depending on the process conditions. Accordingly, it is difficult to stably maintain the excellent characteristics in the reaction chamber.

The present invention has been achieved in view of the foregoing circumstances and a primary object thereof is to enable a transistor adapted to suppress characteristic degradation resulting from fluorine contained in the thin film composing the transistor to provide excellent reliability even when it is continuously driven for a long period of time at a relatively high temperature.

To attain the object, the present invention focuses attention on the gate insulating film of the transistor and reduces the concentration of fluorine contained in the gate insulating film to $1 \times 10^{20}$ atoms/cm$^3$ or less, preferably to $1 \times 10^{19}$ atoms/cm$^3$ or less.

When the gate insulating film is deposited by using a CVD apparatus, the surface of an electrode is composed of a non-porous layer in the reaction chamber of the CVD apparatus as specific means for thus implementing a reduction in the concentration of the contained fluorine.

As a result, carriers trapped by fluorine in the surface of the gate insulating film in contact with the semiconductor film are reduced so that the ON-state current characteristic of the transistor is improved. At the same time, fluorine ions in the gate insulating film are reduced so that the threshold characteristic of the transistor is improved. In addition, even when the transistor is continuously driven for a long period of time at a relatively high temperature, excellent reliability is obtainable.

When the gate insulating film is deposited by using a CVD apparatus, the root cause of the remaining of fluorine in the porous layer (e.g., formed by an anodic oxidation process for forming a protective film) as the surface of the electrode in the reaction chamber thereof can be removed. Compared with the case where the process of removing residual fluorine by using a hydrogen plasma is performed, the production of a faulty transistor resulting from insufficient removal of fluorine due to variations in process conditions and the resultant reduction in yield can be suppressed.

In the structure described above, the transistor is preferably of a field-effect type. The gate insulating film is preferably an amorphous silicon nitride film. The gate insulating film is preferably deposited by a CVD method. The transistor described above is suitable for use as a switching element for a pixel electrode portion in a liquid crystal display device.

By adjusting the concentration of fluorine contained in the gate insulating film of a transistor to $1 \times 10^{20}$ atoms/cm$^3$ or less, preferably to $1 \times 10^{19}$ atoms/cm$^3$ or less, the present invention not only allows excellent initial characteristics to be obtained but also allows an improvement in reliability even when a transistor is continuously driven for a long period of

DETAILED DESCRIPTION OF PREFERRED EMBODIMENTS

Figure 1:
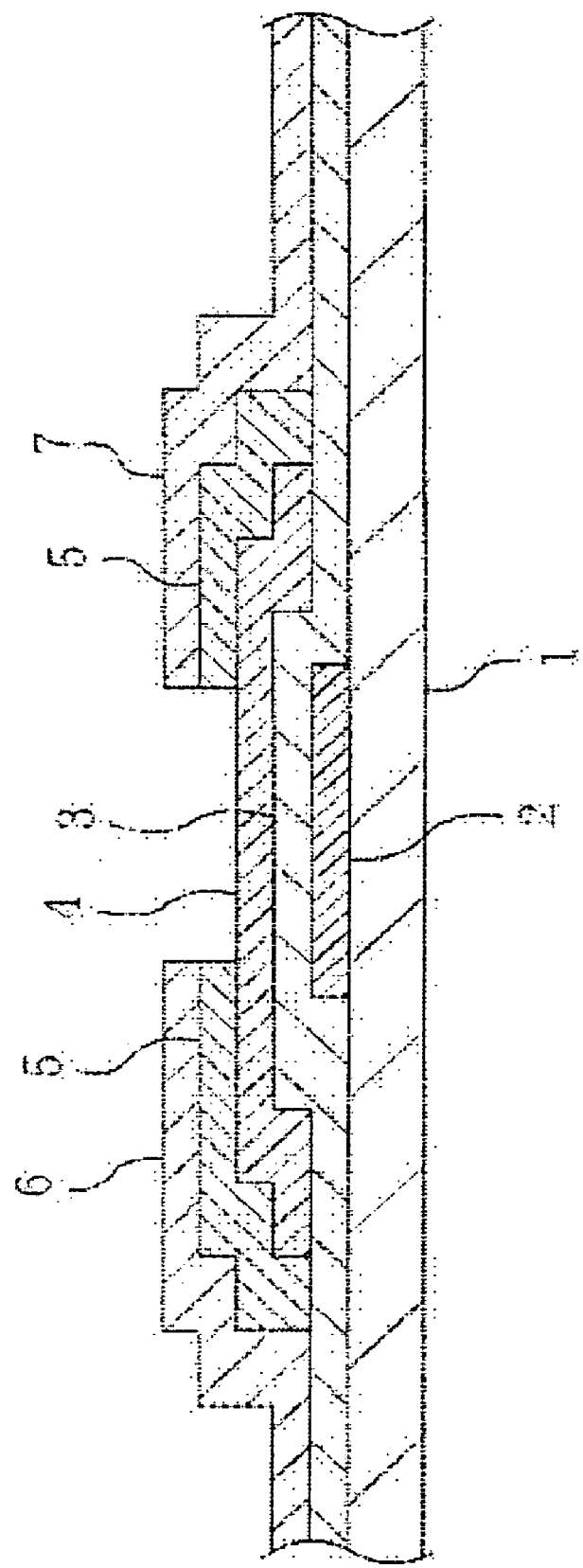
FIG. 1 is a cross-sectional view schematically showing an overall structure of a field-effect thin-film transistor according to an embodiment of the present invention.

Referring to the drawings, the embodiment of the present invention will be described herein below. It is to be noted that the present invention is not limited to the following embodiment and can be designed appropriately as necessary.

FIG. 1 schematically shows a cross section of a field-effect thin-film transistor according to the present embodiment. The transistor is used as, e.g., a switching element for a pixel electrode portion in a liquid crystal display device.

The foregoing transistor comprises an insulating substrate (1) made of, e.g., glass or the like. A gate electrode (2) made of Ta, Al, Mo, or the like is formed on the substrate (1). A gate insulating film (3) composed of, e.g., an amorphous silicon nitride film with a thickness of, e.g., 4000 Å is formed on the gate electrode (2) to cover substantially the entire surface of the substrate (1). An amorphous silicon semiconductor film (4) as a semiconductor film with a thickness of, e.g., 2000 Å is formed on the gate insulating film (3) with the portion thereof corresponding to the gate electrode (2) being disposed at the center. A pair of n$^+$ amorphous silicon semiconductor films (5) each having a thickness of, e.g., 500 Å and doped with phosphorus are formed on the two regions of the amorphous silicon semiconductor film (4) with the gate electrode (2) interposed therebetween to serve as semiconductor films other than the amorphous silicon semiconductor film (4). A source electrode (6) and a drain electrode (7) each made of Ti, Mo, Al, or the like are formed over the individual n$^+$ amorphous silicon semiconductor films (5) and the respective portions of the gate insulating film (3) continued thereto.

A description will be given next to the process steps of fabricating the transistor thus constituted. First, the gate electrode (2) is formed on the substrate (1) through deposition and patterning. Then, a diode parallel-plate plasma-enhanced CVD apparatus is used and, after the cleaning of the reaction chamber thereof using NF$_3$ gas, the gate insulating film (3) is deposited. Thereafter, a first semiconductor film for obtaining the amorphous silicon semiconductor film (4) and a second semiconductor film for obtaining the n$^+$ amorphous silicon semiconductor films (5) are deposited individually. Then, a multilayer film comprising the first and second semiconductor films is patterned into an island configuration to form the amorphous silicon semiconductor film (4) first.

Further, the source electrode (6) and the drain electrode (7) are formed over the specified portions of the gate insulating film (3) and the multilayer film through deposition and patterning. Then, by using the pattern of the source electrode (6) and the drain electrode (7), etching for dividing the second semiconductor film is performed with respect thereto to form the n$^+$ amorphous silicon semiconductor films (5). By the process described above, the field-effect thin-film transistor is completed.

Figure 2:
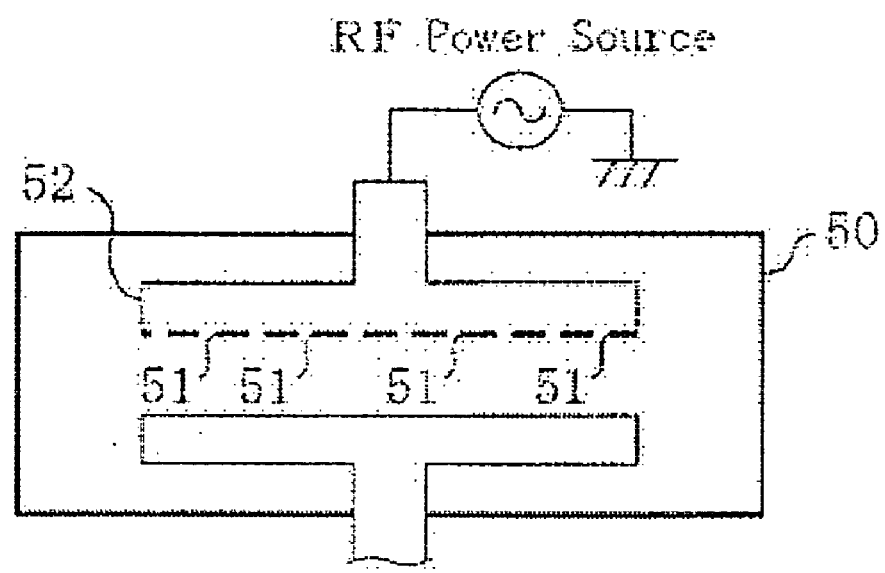
FIG. 2 is a schematic view showing an overall structure of a CVD apparatus used to deposit a gate insulating film.
Figure 3:
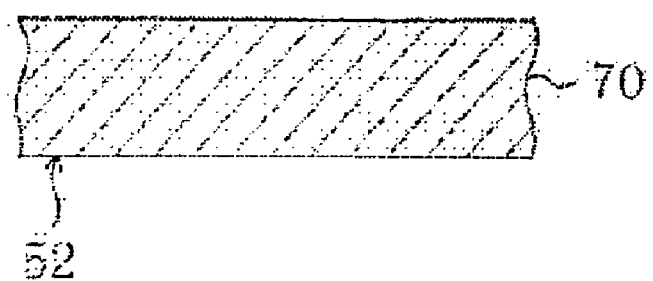
FIG. 3 is a cross-sectional view schematically showing a structure of a surface of an anode in the reaction chamber of the CVD apparatus.

A description will be given herein below to the reaction chamber of the plasma CVD apparatus mentioned above with reference to FIG. 2. In the reaction chamber (50), an anode (52) made of aluminum and having a large number of gas supply holes (51) is disposed. Unlike in the conventional case, an anodic oxidation process for forming a protective film has not been performed with respect to the surface of the anode (52). Accordingly, as schematically shown in enlarged relation in FIG. 3, the surface of the anode (52) is composed of an aluminum layer (70) as a non-porous film which is exposed in an unprocessed state.

Figure 4:
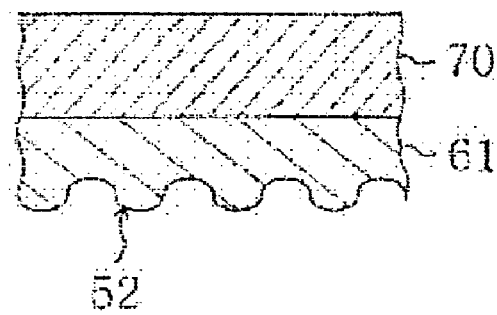
FIG. 4 is a view schematically showing a structure of a surface of an anode in the reaction chamber of a conventional CVD apparatus, which corresponds to FIG. 3.

Specifically, in the conventional case, an anodic oxidation protective film (61) made of alumite is formed on the surface of the aluminum layer (70) by the anodic oxidation process for forming the protective film, as schematically shown in FIG. 4. Because the anodic oxidation protective film (61) is porous, fluorine is likely to be trapped by the insides of fine holes therein, which causes a large amount of fluorine to remain in the reaction chamber (51) after cleaning. By contrast, the present embodiment has eliminated the root cause described above by forming the aluminum layer (70) as the surface of the anode (52), i.e., by not forming the anodic oxidation protective film (61) as formed conventionally on the surface of the aluminum layer (70). As means for implementing the non-porous surface, a new non-porous layer may also be formed on the surface of the aluminum layer (70).

For comparison, by using a conventional CVD apparatus in which the surface of the anode (52) is composed of the anodic oxidation protective film (61), cleaning of the inside of the reaction chamber (50) was performed and then a hydrogen plasma process was performed continuously for 60 seconds under conditions such that the output of a radio-frequency power source (RF power source) was 1000 W and the flow rate of gas was 3 L/min (at $1.013 \times 10^5$ Pa and 0° C.). As a result, the concentration of fluorine contained in the gate insulating film (3) was $3 \times 10^{20}$ atoms/cm$^3$. By contrast, in the present embodiment, values of $7 \times 10^{18}$ to $1 \times 10^{19}$ atoms/cm$^3$ were steadily obtained under the same conditions.

Although the foregoing embodiment has described the case where the two semiconductor layers, which are the amorphous silicon semiconductor film (4) and the n$^+$ amorphous silicon semiconductor film (5), are used, the present invention is also applicable to a transistor using a single-layer semiconductor film.

Although the foregoing embodiment has described the case where the gate insulating film (3) is an amorphous silicon nitride film, the present invention is also applicable to a transistor in which the gate insulating film (3) is a film other than the amorphous silicon nitride film such as, e.g., an amorphous silicon dioxide film, an amorphous aluminum oxide film, or the like.

Although the foregoing embodiment has used the anode (52) having the surface thereof composed of the non-porous layer in the reaction chamber (50) to reduce the concentration of fluorine contained in the gate insulating film (3) when the gate insulating film (3) of the transistor is deposited by using the CVD apparatus, means for reducing the concentration of the contained fluorine is not particularly limited. Another means can be used as appropriate.

Although the foregoing embodiment has described the case where a plasma CVD method is used to deposit the gate insulating film (3) of the transistor, the present invention is also applicable to the case using a sputtering method such as, e.g., RF sputtering, ECR sputtering, or reactive sputtering. In the case of using a CVD method also, the present invention is applicable to a transistor in which the gate insulating film (3) is deposited by a method other than plasma CVD method such as a thermal CVD method or an optical CVD method.

Although the foregoing embodiment has described the case where the transistor is used for an application as a switching element for a pixel electrode portion in a liquid crystal display device, the present invention is also applicable to a transistor used for another application.

EXPERIMENTAL EXAMPLES

A description will be given herein below to an experiment performed to examine the concentration [Unit: atoms/cm$^3$] of fluorine contained in the gate insulating film of a transistor and the respective initial characteristics of the threshold (Vth [Unit: V]) and ON-state current (Ion [Unit: nA]) thereof. As for the concentration of the contained fluorine, it was determined by depositing an amorphous silicon nitride film under the same conditions as for a gate insulating film on a silicon wafer and measuring the concentration of fluorine contained in the amorphous silicon nitride film by secondary ion mass spectrometry (SIMS). As the transistor, a transistor in which the ratio between the channel width W and the channel length L was W/L=4 was used.

Figure 5:
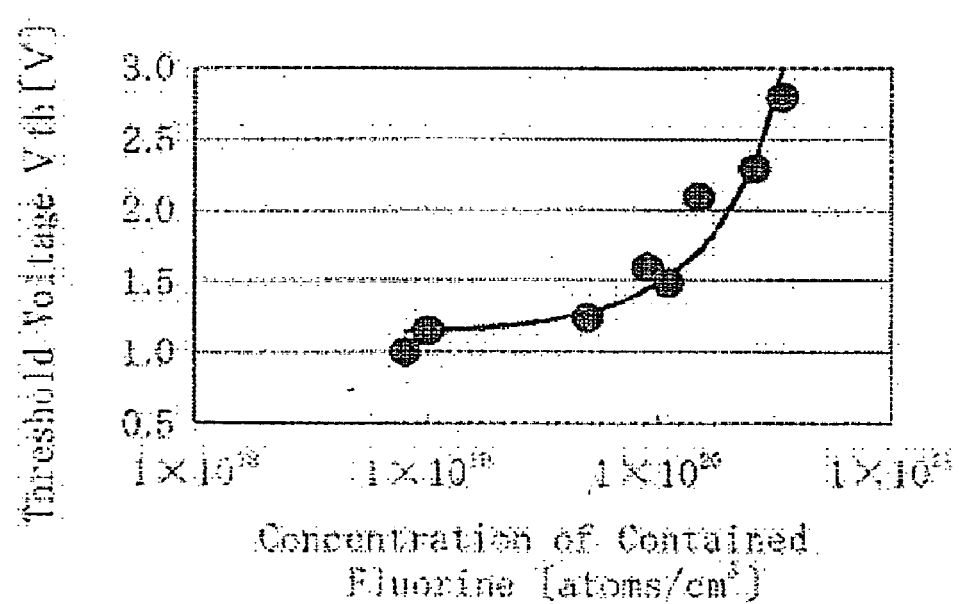
FIG. 5 is a characteristic view showing the relationship between the concentration of fluorine contained in a gate insulating film and the threshold voltage of a transistor.
Figure 6:
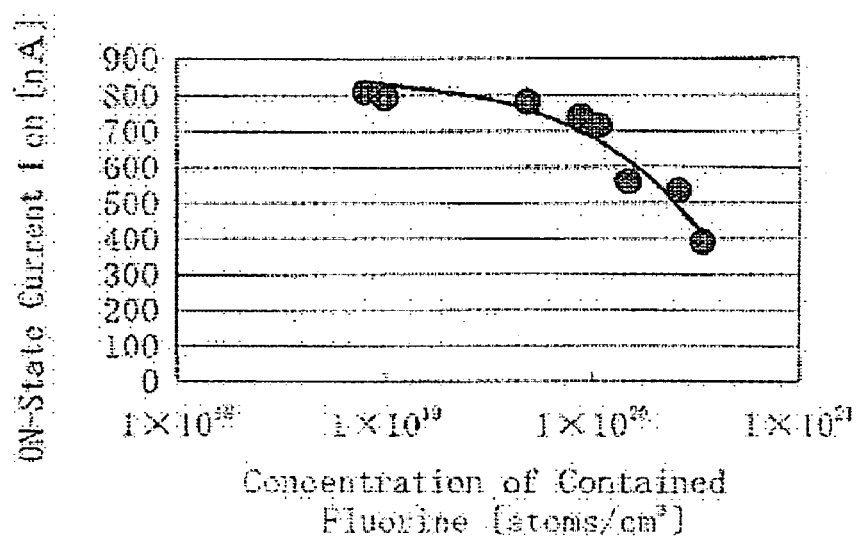
FIG. 6 is a characteristic view showing the relationship between the concentration of fluorine contained in the gate insulating film and the ON-state current characteristic of the transistor.

The characteristic view of FIG. 5 shows the initial characteristic between the concentration of fluorine contained in the gate insulating film and the threshold voltage of the transistor. The characteristic view of FIG. 6 shows the initial characteristic between the concentration of fluorine contained in the gate insulating film and the ON-state current characteristic of the transistor.

From the drawings, it will be understood that the initial transistor characteristics are excellent provided that the concentration of the contained fluorine is $1\times10^{20}$ atoms/cm$^3$ or less, preferably $1\times10^{19}$ atoms/cm$^3$ or less.

A description will be given next to an experiment performed to examine the relationship between the concentration of fluorine contained in the gate insulating film and the reliability of the transistor during the long-period driving thereof at a high temperature.

In the conventional case (see Patent Gazette 2), the reliability was evaluated under conditions such that each of the source and drain was grounded, the gate DC voltage was 30 V, and the drive time was 10 minutes in an environment where the temperature was 25.0±3.0° C. However, when a field-effect thin-film transistor is applied to, e.g., a liquid crystal display device, the guarantee of the operation at a higher temperature for a longer period of time is requested so that the evaluation of the reliability was performed herein under conditions such that each of the source/drain electrodes was grounded, the gate DC voltage was 15 V, and the drive time was 500 hours in an environment where the temperature was 80.0±3.0° C. As an index for judging the reliability, an amount of shift ΔVth [Unit: V] as a value obtained by subtracting the threshold voltage after a reliability evaluation test from the initial threshold voltage of the transistor was evaluated.

As a result, in the transistor in which the concentration of the contained fluorine was $2.7\times10^{20}$ atoms/cm$^3$, the amount of shift was ΔVth=5.0 V, while ΔVth=3.0 V was measured in the transistor in which the concentration of the contained fluorine was $1.0\times10^{20}$ atoms/cm$^3$. This proved that the reliability under high-temperature and long-period conditions improved more greatly as the concentration of fluorine contained in the gate insulating film was lower.

The present invention can be used for a typical common transistor and is particularly preferable for a transistor which is continuously driven for a long period of time at a relatively high temperature, such as a transistor used as a switching element for a pixel electrode portion in a liquid crystal display device.

What is claimed is:

1. A CVD apparatus used to deposit a gate insulating film of a transistor including a source electrode and a drain electrode arranged opposite to each other, a semiconductor film including at least one layer disposed between the source electrode and the drain electrode, a gate electrode disposed adjacent to the semiconductor film, and the gate insulating film disposed between the gate electrode and each of the source electrode, the drain electrode, and the semiconductor film, the CVD apparatus comprising:

an electrode having a plurality of gas supply holes and disposed in a reaction chamber, the electrode including a surface that is composed of a non-porous layer;

wherein the transistor is disposed in the reaction chamber, the transistor is a field-effect transistor in which the gate insulating film and the semiconductor film are formed in that order, and the semiconductor film is disposed on the gate insulating film; and the electrode of the CVD apparatus is adapted to form the gate insulating film such that the gate insulating film is made of an amorphous silicon nitride film and has a concentration of fluorine in a range of about $7\times10^{18}$ atoms/cm$^3$ to about $1\times10^{20}$ atoms/cm$^3$.

2. A transistor comprising the gate insulating film formed by the CVD apparatus according to claim 1.

* * * * *